United States Patent
Ham et al.

(10) Patent No.: US 10,739,426 B2
(45) Date of Patent: Aug. 11, 2020

(54) MAGNETIC RESONANCE IMAGING WITH IMPROVED THERMAL PERFORMANCE

(71) Applicant: KONINKLIJKE PHILIPS N.V., Eindhoven (NL)

(72) Inventors: Cornelis Leonardus Gerardus Ham, Oirschot (NL); Martijn Krelis Termeer, Poppel (BE)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 16/309,165

(22) PCT Filed: Jun. 28, 2017

(86) PCT No.: PCT/EP2017/065973
§ 371 (c)(1),
(2) Date: Dec. 12, 2018

(87) PCT Pub. No.: WO2018/002126
PCT Pub. Date: Jan. 4, 2018

(65) Prior Publication Data
US 2019/0310333 A1    Oct. 10, 2019

Related U.S. Application Data

(60) Provisional application No. 62/355,359, filed on Jun. 28, 2016, provisional application No. 62/396,940, filed on Sep. 20, 2016.

(51) Int. Cl.
*G01V 3/00* (2006.01)
*G01R 33/38* (2006.01)
(Continued)

(52) U.S. Cl.
CPC ...... *G01R 33/3804* (2013.01); *G01R 33/3403* (2013.01); *G01R 33/3856* (2013.01); *G01R 33/543* (2013.01)

(58) Field of Classification Search
CPC .............. G01R 33/5608; G01R 33/543; G01R 33/3815; G01R 33/3804; A61B 5/055
(Continued)

(56) References Cited

U.S. PATENT DOCUMENTS 8,287,268 B1 * 10/2012 Thomas .................... F26B 5/14
425/382.4
2002/0156595 A1    10/2002 Hedlund et al.
(Continued)

FOREIGN PATENT DOCUMENTS

KR    20090020379    *   2/2009

*Primary Examiner* — Walter L Lindsay, Jr.

(57) ABSTRACT

A magnetic resonance (MR) imaging apparatus comprises an MR imaging device (10) including a magnet (12) and heat generating components (18, 20, 22, 24). A cooling system (30) cools the heat generating components using chilled water from an air-cool chiller (28). Sensors (TS, VS) are configured to measure thermal parameters of the heat generating components or of the cooling system. An MR controller (40) controls the MR imaging device to execute an MR imaging examination program ("exam card") (42) and to adjust the execution of the MR imaging examination program in response to a thermal parameter measured by the one or more sensors indicating the cooling system has insufficient cooling capacity. The MR controller may also adjust the exam card prior to its execution if the cooling system (30) has insufficient cooling capacity at the current air temperature to dissipate the heat load as estimated by a power dissipation model (80).

20 Claims, 5 Drawing Sheets

(51) Int. Cl.
*G01R 33/34* (2006.01)
*G01R 33/385* (2006.01)
*G01R 33/54* (2006.01)

(58) Field of Classification Search
USPC .......................................................... 324/322
See application file for complete search history.

(56) References Cited

U.S. PATENT DOCUMENTS

| | | |
|---|---|---|
| 2004/0017195 A1 | 1/2004 | Kassai et al. |
| 2005/0148845 A1* | 7/2005 | Dean .................. G01R 33/3804 600/407 |
| 2007/0289324 A1* | 12/2007 | Suzuki .................... F25D 19/00 62/259.2 |
| 2009/0015258 A1 | 1/2009 | Nozaki |
| 2010/0069738 A1 | 3/2010 | Holger |
| 2013/0038328 A1 | 2/2013 | Iwasa et al. |
| 2013/0336348 A1* | 12/2013 | Xiong ....................... H01S 3/04 372/36 |
| 2014/0009151 A1* | 1/2014 | Van Helvoort .... G01R 33/3856 324/307 |
| 2015/0346296 A1* | 12/2015 | Biber ................. G01R 33/3815 505/162 |
| 2017/0045590 A1 | 2/2017 | Takai et al. |

* cited by examiner

MAGNETIC RESONANCE IMAGING WITH IMPROVED THERMAL PERFORMANCE

CROSS REFERENCE TO RELATED APPLICATIONS

This application is a U.S. national phase application of International Application No. PCT/EP2017/065973, filed on Jun. 28, 2017, which claims the benefit of U.S. provisional Application Ser. No. 62/355,359 filed on Jun. 28, 2016 and U.S. provisional Application Ser. No. 62/396,940 filed Sep. 20, 2016, both of which are incorporated herein by reference.

FIELD

The following relates generally to the medical imaging arts, magnetic resonance imaging arts, and the like.

BACKGROUND

Magnetic resonance (MR) imaging presents a large thermal load. Components that need to be kept cooled include the magnet cryo-compressor (used to maintain liquid helium for cooling the typically superconducting magnet), magnetic field gradient coils, the gradient coil amplifiers, and the radio frequency (RF) amplifier. Other components requiring cooling may also be present.

In a typical medical facility, a commercially available air cooled chiller is used to provide chilled water for cooling the MR imaging device. The chiller may be a dedicated unit, or may be a general-purpose chiller, e.g. a hospital chiller that supplies chilled water for diverse purposes. A liquid cooling cabinet (LCC) provides interfacing between the chilled water and individual cooling systems of the MR imaging device. In a typical arrangement, heat exchangers thermally couple the chilled water to various coolant circuits that cool individual MR components. The coolant circuits are usually isolated from the chilled water, and the various coolant circuits may employ water or other fluids as the coolant. The coolant is maintained at a controlled temperature using a mixing valve to mix "cold" coolant from the heat exchanger and "hot" coolant delivered by a coolant return line from the cooled MR component. The coolant is driven by natural circulation or actively using pumps. In some designs, the cryo-compressor is directly cooled by chilled water from the air-cooled chiller, although provision of an isolating heat exchanger may also be used.

In designing the cooling system for an MR imaging device, the chiller capacity is typically chosen to meet the maximum credible heat load under the least favorable credible operating conditions for the chiller. The maximum credible heat load can be determined as follows. An MR imaging examination of a patient typically includes a sequence of MR imaging scans. The sequence is represented for entry into the MR imaging device controller the form of an examination card ("exam card" is used herein; the representation may be referred to by different nomenclatures depending upon the MR imaging device manufacturer/model and/or the medical facility). The heat load produced by the MR imaging device depends on the scan type of the scan being executed and its parameters. For example, one common metric of heat load is the root-mean-square magnetic field gradient field ($G_{rms}$), which is affected by various parameters of the MR scan. A higher value for $G_{rms}$ will impose a higher heat load. In general, most of the scans have a low heat load, some a moderate and just a small number of scans have a high heat load. Other illustrative metrics of the heat load produced by an MR scan include the frequency spectrum of the magnetic field gradients (since the magnetic gradient coil impedance is frequency-dependent) and the $B_{1,rms}$ field generated by the RF excitation. The maximum credible heat load can be determined assuming worst-case values (from the heat load viewpoint) for the various scan parameters and metrics, e.g. highest $G_{rms}$, highest gradient frequency content, highest RF pulse energy, and so forth. The exam card definition and the patient workflow can also affect the heat load, and again worst-case values are assumed, e.g. a contiguously performing a series of consecutive maximum-load scans.

The principal operating condition parameter for an air-cooled chiller is the temperature of the ambient air, i.e. the outdoor air temperature for the usual case in which the chiller is installed outdoors. The cooling capacity of a chiller is a function of the outdoor air temperature and the water temperature: The lower the outdoor air temperature, the higher the cooling capacity and the higher the water temperature, the higher the cooling capacity. The nominal cooling capacity of the chiller is usually defined at a design-basis worst case outdoor air temperature and at a default water temperature, e.g. 12° C. During most of the year the outdoor air temperature is significantly lower than the design-basis worst case temperature at which the chiller nominal cooling capacity is defined. There is a spread in the actual cooling capacity as function of the outdoor temperature.

If the chiller capacity is overloaded, then a chain of events is initiated which eventually leads to an MR imaging scan abort. Initially, as the overloaded chiller is unable to handle the heat load the chilled water will begin to increase in temperature. The cooling capacity of the chiller is higher with a higher water temperature, which initially counters this temperature increase; thus, the chilled water temperature increases until a new equilibrium is reached. There is also some margin in the cooling chain (i.e. the coolant circuits providing cooling to the individual MR imaging device components). The temperature of the chilled water supplied by the chiller can increase somewhat in temperature before coolant circuits cannot hold the temperature of the coolant, and moreover the coolant can increase in temperature by some amount before the cooled MR imaging device component overheats and a thermal interlock is triggered that aborts the MR imaging scan. But eventually, if the chiller overload continues unabated, the coolant temperature for some component (or the temperature of the component itself) exceeds its interlock threshold and triggers a scan abort.

Since scan aborts are undesirable, the design-basis maximum load and maximum outdoor temperature values are usually chosen to be so large as to essentially eliminate the possibility of a scan abort due to thermal runaway. However, this robustness against scan aborts is obtained at the cost of employing a high-capacity chiller, which increases the initial cost of the MR imaging device installation, and increases maintenance and replacement costs down the line. MR imaging facility operational expenses are also impacted as a higher-capacity chiller uses more energy to operate.

The following discloses a new and improved systems and methods that address the above referenced issues, and others.

SUMMARY

In one disclosed aspect, a magnetic resonance (MR) imaging apparatus comprises: an MR imaging device including a magnet and heat generating components; a cooling system connected to cool the heat generating components of the MR imaging device using chilled water; one or more sensors each configured to measure a thermal parameter of the heat generating components of the MR imaging device or of the cooling system; an MR controller comprising an electronic processor programmed to control the MR imaging device to execute an MR imaging examination program and to adjust the execution of the MR imaging examination program in response to a thermal parameter measured by the one or more sensors indicating the cooling system has insufficient cooling capacity.

In another disclosed aspect, an MR imaging apparatus comprises an MR imaging device including a magnet and heat generating components, and a cooling system connected to cool the heat generating components of the MR imaging device using chilled water. An MR controller comprises an electronic processor programmed to control the MR imaging device to execute an MR imaging examination program and to analyze the MR imaging examination program prior to its execution to estimate a heat load to be generated by executing the MR imaging examination program, and adjust the MR imaging examination program prior to its execution if the cooling system has insufficient cooling capacity to cool the estimated heat load.

In another disclosed aspect, an MR imaging method is disclosed, which is performed by an MR imaging device including a magnet and heat generating components, and a cooling system connected to cool the heat generating components of the MR imaging device using chilled water. The MR imaging method comprises executing an MR imaging examination program using the MR imaging device. During the executing, thermal parameters are monitored of at least one of the MR imaging device and the cooling system. The execution of the MR imaging examination program is adjusted in response to the monitored thermal parameters indicating the cooling system has insufficient cooling capacity.

In another disclosed aspect, a non-transitory storage medium stores instructions readable and executable by an electronic data processing device to perform a thermal modeling method for estimating heat dissipation of a magnetic resonance (MR) imaging device that includes a magnet, magnetic field gradient amplifiers. magnetic field gradient coils driven by the magnetic field gradient amplifiers, and a radio frequency (RF) amplifier connected to drive an RF coil, the thermal modeling method. The thermal modeling method includes: estimating heat output of a magnetic field gradient chain comprising the magnetic field gradient amplifiers and magnetic field gradient coils based on magnetic field gradients applied by the magnetic field gradient chain; estimating heat output by the RF amplifier based on RF power generated by the RF amplifier; and generating a total heat dissipation estimate by adding together the estimated heat output of a magnetic field gradient chain, the estimated heat output of the RF amplifier, and an estimated baseline heat output that is not dependent on the magnetic field gradients and is not dependent on the RF power.

One advantage resides in providing lower cost MR imaging device installation.

Another advantage resides in providing an MR imaging device installation with reduced maintenance and replacement cost.

Another advantage resides in providing an MR imaging device installation with higher energy efficiency and hence lower operating cost.

Another advantage resides in providing an MR imaging device with visualization of energy consumption performance enabling tailoring of MR imaging to enhance energy efficiency and and environmental friendliness.

Another advantage resides in providing an MR imaging device with improved robustness against scan aborts caused by thermal runaway.

Another advantage resides in providing a thermal budget dashboard or other display which shows heat dissipation by the MR imaging device and compares the heat dissipation with current chiller capacity.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention. Unless otherwise noted, the drawings are diagrammatic and are not to be construed as being to scale or to illustrate relative dimensions of different components.

DETAILED DESCRIPTION

Figure 1:
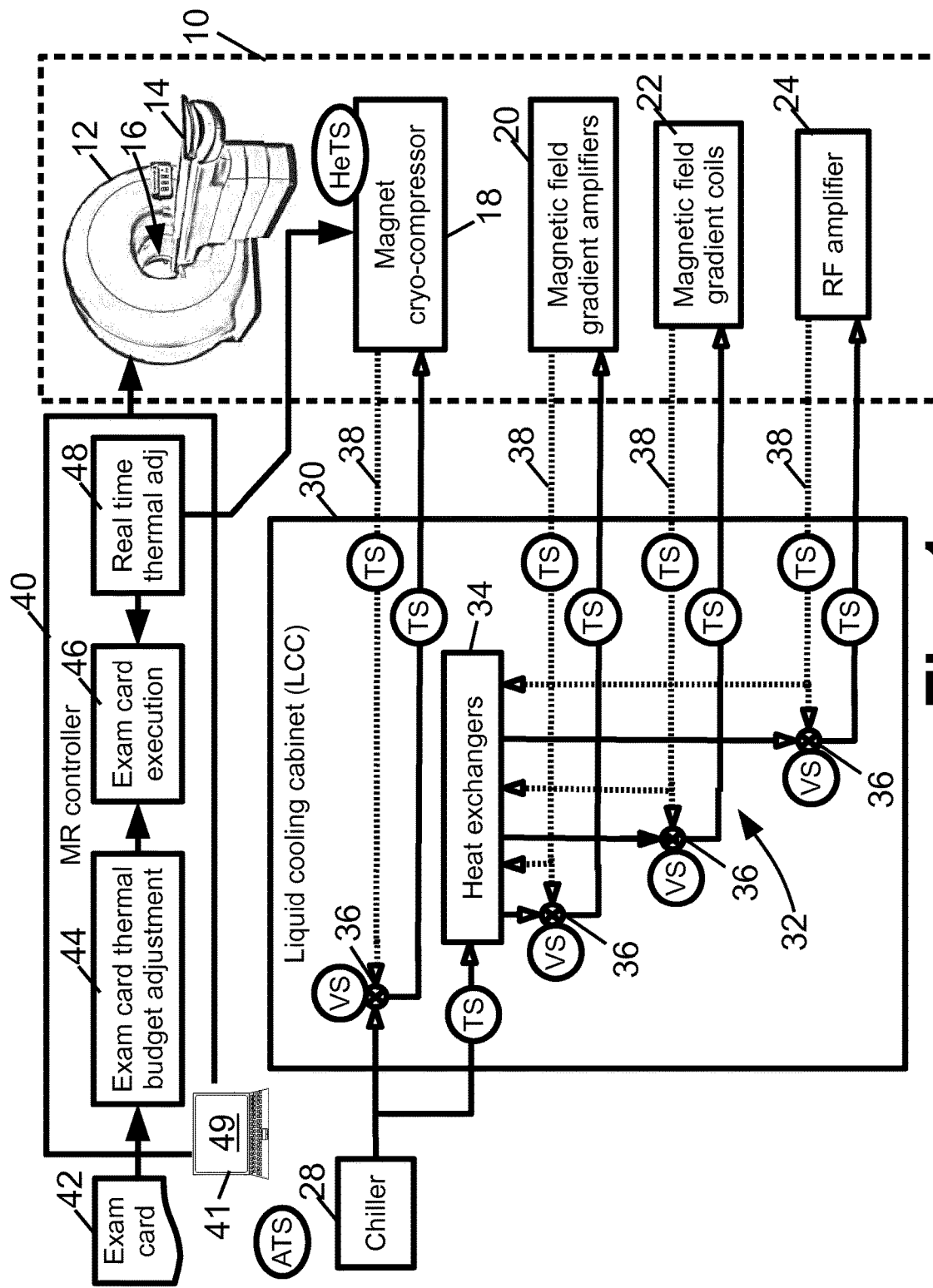
FIG. 1 diagrammatically shows salient features of a magnetic resonance (MR) imaging device and supporting infrastructure including component cooling.

Embodiments disclosed herein facilitate the use of a lower-capacity chiller for cooling an MR imaging device without concomitant loss of robustness against thermal runaway-induced scan aborts. This is achieved by monitoring the temperatures and/or positions of control valves in the cooling circuits during an MR imaging examination. If a temperature or control valve setting approaches a limit value (e.g. a mixing valve approaching it maximum cool setting), remedial action is taken, such as inserting a pause in the exam card, or within a scan, or temporarily switching off the cryo-compressor (under conditions where thermal inertia ensures no risk of helium loss or magnet quench). This reduces the heat load and keeps the temperatures within an acceptable level and avoids a scan abort. Additionally or alternatively, the exam card can be analyzed before it is executed to estimate the thermal load of each scan, and pauses may be inserted into the exam card, e.g. scan pauses during a scan and/or pauses between scans, and/or scans may be re-ordered within the exam card, and/or scan parameters may be adjusted to reduce thermal loading, such that execution of the exam card will not overload the chiller.

The heat load produced by an MR imaging device varies with the type of scan, type of exam card, and the type of site (patient load). Short periods of time with very high heat dissipation can be buffered in the MR imaging device components (gradient coil, gradient amplifier, water in the cooling system). When designing the cooling system, it is more appropriate to look at the heat load over a longer period of time, for instance 40 minutes as a non-limiting illustrative example.

An example of a conventional worst case scenario design approach is as follows. For a certain gradient configuration the mean value of the heat load over 40 minutes can (as an illustrative example) be 25 kW, with a standard deviation $\sigma=3.5$ kW. The mean value+$3\sigma$ is therefore more than 35 kW. The nominal cooling capacity of the chiller is defined from a design basis worst case outdoor temperature and a design basis chilled water temperature of 12° C. One would expect that the cooling capacity has to be of the order of the mean+$3\sigma$ value (35 kW). Such a chiller has far more capacity than is needed to handle the typical situation of 25 kW heat dissipation. But, if a small chiller (e.g. 20-25 kW) is used, then there is a considerable risk of a scan abort when a scan with higher-than-average heat dissipation is run, in which case there is insufficient cooling for one or more components (e.g. the gradient coil) leading to thermal runaway and tripping of the gradient coil thermal interlock leading to a scan abort.

In embodiments disclosed herein, The MR imaging device monitors thermal parameters such as coolant temperatures and/or component temperatures and/or mixing valve positions. When any one of these parameters approaches its limit value, remedial action is taken to control the heat load and prevent a scan abort. The remedial action may, for example, include one or more of the following: inserting a pause in the exam card; inserting a pause in a scan; modifying a scan parameter (e.g. thereby lowering the $G_{rms}$ metric, $B_{1,rms}$ metric, or other thermal load metric) of a not-yet-performed scan of the exam card; temporarily switching off the cryo-compressor; or various combinations thereof. The remedial action of temporarily switching off the cryo-compressor is only performed if it is determined that there is no risk of losing helium and no risk of a magnet quench. In practice, the magnet has a large thermal inertia due to the relatively large volume of liquid helium and the thermal insulation provided by typical vacuum jacketing of the helium cryostat, and so it is usually possible to temporarily shut off the cryo-compressor to reduce heat load over a time interval on the scale of a typical exam card (e.g., 40 minutes in some patient examinations).

The foregoing is a real-time approach in which thermal parameters of the MR device are monitored in real-time and used to trigger remedial action(s). In another approach, the thermal load is predicted before executing the exam card and the exam card is adjusted on the basis of the thermal load. This a priori analytic approach can be used in addition to, or alternative to, the real-time approach. In the a priori analytic approach, the exam card is analyzed prior to its execution by the MR imaging device to estimate the actual cooling performance of the chiller. This analysis is preferably performed with the additional input of the current outdoor temperature, since the chiller capacity depends on the actual outdoor air temperature. This is a more proactive way of control as compared with the real-time remedial approach. In the a priori analytic approach the chilled water temperature is predicted as a function of temperature over the execution time of the exam card. This prediction enables measures, such as changing the scan order in the ExamCard, skipping a thermally expensive scan, or modifying a scan parameter to lower heat dissipation.

The disclosed a priori and/or real-time thermal management approaches provide, as one possible benefit, the ability to use a lower-capacity chiller. With the disclose approaches, the nominal value of the chiller cooling capacity can be viewed as a function of the probability that a remedial measure or exam card adjustment will be applied by the thermal management. The goal is for designing chiller capacity is then to limit the frequency of such remedial actions/adjustments to an acceptable level.

A further advantage of the disclosed approaches is that the measurement of the temperatures and mixing valve positions can also be used for diagnostic purposes. For example, if cooling performance of the chiller is much less than expected (so that numerous pauses or other remedial actions or exam card adjustments are being inserted), there this may indicate a problem with the chiller. Also the temperature-time curve after e.g. a step function can provide diagnostic information.

With reference to FIG. 1, a magnetic resonance (MR) imaging apparatus includes an MR imaging device 10 is diagrammatically indicated, and includes a magnet 12, which is typically a superconducting magnet disposed in a liquid helium (LHe) or other type of cryostat to maintain the superconducting magnet windings in a superconducting state. The illustrative MR imaging device 10 further includes a subject support 14, e.g. a patient couch, via which an imaging subject (a patient or medical subject in the case of medical imaging; more generally, the imaging subject could be some other subject such as an archaeological mummy, a dog or cat in a veterinary setting, or so forth) is loaded into an examination field of view 16 of the magnet 12. The MR imaging device 10 further includes various heat-generating components which are diagrammatically indicated in FIG. 1, such as a cryo-compressor 18 that maintains the magnet 12 in its superconducting state, magnetic field gradient amplifiers 20 that drive magnetic field gradient coils 22, and a radio frequency (RF) amplifier 24 that drives a radio frequency coil to excite magnetic resonance (MR) in the imaging subject. In a typical embodiment, the cryo-compressor 18 operates to cool helium in a cryostat of the magnet 12 to maintain the helium in a liquid state, i.e. as liquid helium (LHe), which has a boiling point of about 4K (varies slightly depending on pressure). Thus, superconducting magnet windings immersed in LHe are maintained at below the critical temperature ($T_C$) for typical superconducting magnet winding materials. The magnetic field gradient amplifiers 20 and gradient coils 22 are typically constructed to provide independent x-, y-, and z-gradient fields, although other gradient coil designs are contemplated. The RF amplifier 24 drives a whole-body or local RF coil (not shown) to excite magnetic resonance. The MR imaging device 10 includes other components which are not salient here and hence not illustrated, such as for example an RF receiver for receiving MR signals. Further, while certain heat-generating MR components 18, 20, 22, 24 are illustrated as examples, it will be appreciated that various MR imaging devices may have additional and/or other heat-generating components The MR imaging device 10 is cooled by an air-cooled chiller 28 that provides chilled water for this purpose (and possibly also for the purpose of cooling other unrelated systems or devices, for example in the case of a general-purpose hospital chiller). More particularly, the heat-generating MR components 18, 20, 22, 24 are cooled by a cooling system 30 which is connected to cool the heat generating components 18, 20, 22, 24 of the MR imaging device using chilled water provided by the air-cooled chiller 28. Principle components of the illustrative cooling system 30 are disposed in a liquid cooling cabinet (LCC)—accordingly, the reference number 30 is used in FIG. 1 to label the LCC containing the principal components of the cooling system 30 for illustrative convenience. The illustrative cooling system 30 includes a set of coolant circuits 32 each configured to cool at least one heat-generating component of the MR imaging device using coolant flowing in the coolant circuit. The coolant may be water or may be a different type of coolant, e.g. air. Moreover, the different coolant circuits may employ different types of coolants. A set of heat exchangers 34 are connected with the coolant circuits 32 to transfer heat from the coolant flowing in the coolant circuits 32 to the chilled water provided by the air-cooled chiller 28. In the illustrative example, the temperature of coolant flowing to the heat-generating component is set by a mixing valve 36 that mixes coolant from the heat exchanger 34 with coolant from a return line 38 of the coolant circuit 32 to output mixed coolant at a set point temperature. (In diagrammatic FIG. 1, the return lines 38 are distinguished by dotted lines from the cold fluid inlet lines which are shown as solid lines). The mixing valve 36 of each circuit is automatically adjusted via feedback control to maintain the mixed coolant output at the set point temperature. It will be appreciated that this is only possible over some finite range of "cold" coolant temperatures from the heat exchanger 34—if the chilled water from the chiller 28 becomes too warm then the "cold" coolant temperature will be too high such that even with the mixing valve 36 set to pass only the "cold" coolant from the heat exchanger 34 the output of the mixing valve 36 will be above the set point temperature.

It should be noted that the coolant circuits 32 are shown diagrammatically in FIG. 1, and various detailed coolant circuit topologies are contemplated. For example, the illustrative coolant circuits are closed loop, but open loop or partial open loop circuits are contemplated which include a coolant inlet and a coolant drain or discharge. The coolant circuits may be driven by natural circulation or may be driven or assisted by coolant pumps, which are also not shown in FIG. 1. As a further variant, while in FIG. 1 there is a single coolant circuit for each heat-generating component 20, 22, 24, in other embodiments a single coolant circuit may cool two or more different heat generating components of the MR imaging device. For example, in a variant embodiment the illustrated separate cooling circuits for the gradient amplifiers 20, the gradient coils 22, and the RF amplifier 24 are combined as a single cooling circuit, with flow distribution between the three heat generating components 20, 22, 24 being controlled by a set of flow restrictors. Optionally, the cryo-compressor 18 could be at the secondary cooling circuit as well, with a common cooling circuit cooling the cryo-compressor alone or the cryo-compressor and one or more other heat generating components on the same cooling circuit. As another non-limiting illustrative variant, the temperature control of the chilled water to the cryo-compressor may be performed by the chiller 28, without any additional temperature control such as that provided by the illustrative mixing valve 36 in the illustrative circuit cooling the cryo-compressor 18.

With continuing reference to FIG. 1, the cooling arrangement for the cryo-compressor 18 is different from the cooling arrangement for the other heat-generating component 20, 22, 24, in that the cryo-compressor 18 is cooled directly by the chilled water from the chiller 28, rather than by a different coolant that is in fluid isolation from the chilled water and thermally coupled by a heat exchanger. In the illustrative arrangement, a mixing valve 36 mixes chilled water from the chiller 28 with warmer water carried from the cryo-compressor 18 by a coolant return line 38, and the valve 36 is automatically adjusted via feedback control to maintain the mixed chilled water output from the valve 36 to the cryo-compressor 18 at a desired set point temperature. It should be noted that in other embodiments, the cryo-compressor may be cooled by a fluid-isolated coolant circuit using a heat exchanger in the same way as already described for the coolant circuits 32.

With continuing reference to FIG. 1, to implement the disclosed improved MR imaging device cooling designs, one or more sensors are provided, each of which is configured to measure a thermal parameter of the heat-generating components 18, 20, 22, 24 of the MR imaging device 10 or of the cooling system 30. In illustrative FIG. 1, these sensors include: a set of temperature sensors TS each indicated by a circle circumscribing the reference label TS; and a set of sensors VS that each output the valve setting of a mixing valve 36—these valve sensors are each indicated by a circle circumscribing the reference label VS. In the illustrative embodiment of FIG. 1, temperature sensors TS are arranged to measure temperatures of the coolant in flow lines delivering coolant to the heat-generating components 18, 20, 22, 24, and in coolant return lines 38 of the coolant circuits 32, as well as a temperature sensor TS measuring temperature of coolant flow into the heat exchangers 34; more generally, the temperature sensors may be arranged to measure temperature at other points in the coolant circuits. The valve sensors VS can take various forms, such as valve mechanical position sensors, or flow sensors that detect flow in one of the inlet lines (for example, if the mixing valve is at a limiting setting where no coolant from the return line 38 is mixed in, this can be detected by a flow sensor on the return line segment feeding into the valve), or electrical sensors that detect the valve actuator signal (under the assumption the valve is properly set to the value indicated by the actuator signal). Moreover, these sensors TS, VS are merely illustrative examples, and additional or other sensors may be employed to measure thermal parameters of the heat-generating components 18, 20, 22, 24 of the MR imaging device 10 or of the cooling system 30—for example, temperature sensors measuring the operating temperature of the heat-generating components 18, 20, 22, 24 may be used.

The illustrative temperature sensors TS can be readily seen to directly measure thermal parameters of the cooling system 30. If the chiller 28 has insufficient cooling capacity then these temperatures will start to rise as the cooling system 30 becomes increasingly incapable of dissipating the generated heat. The valve sensors VS measure the mixing valve settings, which are thermal parameters of the cooling system 30 in the following way. If the chiller 28 is providing sufficiently chilled water then the mixing valves 36 will mix in a significant proportion of "hotter" water from the return line 38 to maintain the desired set point temperature(s). By contrast, if the chiller 28 has insufficient cooling capacity then the temperature of the chilled water will begin to rise, and the valve feedback control will begin to mix in a lower proportion of "hotter" water from the return line 38 to obtain the desired set point temperature. As the chiller capacity becomes increasingly insufficient, the mixing valves 36 will move further toward their limit settings providing maximum "cold" coolant from the heat exchangers 34 and minimum (or no) "hot" coolant from the return lines 38.

Furthermore, in some embodiments the cooling capacity of the air-cooled chiller 28 is directly monitored on the basis of the outdoor air temperature as measured by an air temperature sensor ATS, denoted in FIG. 1 by a circle circumscribing the reference label ATS.

With continuing reference to FIG. 1, the MR imaging device 10 is controlled by an MR controller 40, which comprises an electronic processor (e.g. an illustrative computer 41, or a dedicated microprocessor- or microcontroller-based MR controller) along with ancillary components such as non-transitory storage (e.g. hard disk drive, solid state drive or SSD, or so forth) storing MR scan pulse sequences, analog-to-digital and/or digital-to-analog circuitry for interfacing with analog components or signals of the MR imaging device 10, and/or so forth. The MR controller 40 is programmed to control the MR imaging device 10 to execute an MR imaging examination program 42, also referred to herein as an exam card 42, and to adjust the execution of the MR imaging examination program 42 in response to a thermal parameter measured by the one or more sensors TS, VS indicating the cooling system 30 has insufficient cooling capacity.

As used herein, the term "exam card" is used as shorthand for "MR imaging examination program" 42 to denote an executable representation of an MR imaging examination to be performed by the MR imaging device 10. For example, the "MR imaging examination program" 42 or "exam card" 42 may be a structured data file or data container which is formatted to be readable by the MR controller 40. The exam card 42 is read by the MR controller 40 which causes the MR imaging device 10 to execute the operations represented by the exam card 42. The executable representation defined by the exam card 42 may, for example, identify one or more MR scans to perform in some specified order, where each MR scan is executed by the MR imaging device 10 by performing an MR pulse sequence made up of RF pulses, magnetic field gradient pulses (where "pulse" could be temporally extended, e.g. a gradient pulse may be a constant or oscillatory gradient applied for a defined time interval, for example), magnetic resonance read operations, and/or so forth. The MR pulse sequence representing an MR scan may be stored in the exam card 42 itself, but is more commonly stored elsewhere, e.g. in a memory or data storage of the MR imaging device 10, with the exam card 42 storing only a call to or other instruction to retrieve and execute the scan along with scan parameters such as RF excitation pulse strength values, echo time (TE), magnetic field gradient parameters (e.g. frequency), and/or so forth. The exam card 42 also may include representations of other features of the MR imaging examination to be performed, such as including a pause before starting an MR scan to allow the MR imaging device operator to perform one or more operations such as administering a magnetic contrast agent, positioning a local RF coil, or so forth. The exam card 42 may also include a pause during an MR scan, for example to allow for the imaging subject to be instructed to hold his or her breath so as to reduce respiratory cycling artifacts. As already noted, the exam card 42 also typically provides scan parameters for the scan(s) (although if the exam card 42 does not provide a value for a particular scan parameter then some default parameter value may optionally be used).

It should also be noted that the MR controller 40 is typically designed to allow for conditional deviations from the MR imaging examination program (i.e. exam card) 42. For example, the MR controller 40 may provide for the MR imaging device operator to manually pause execution of the MR imaging examination program 42 to allow for the imaging subject to recover from a coughing fit, and/or the MR controller 40 may provide for pausing execution of the MR imaging examination program 42 in response to various automated inputs such as detection of an MR component fault condition.

As previously noted, the MR controller 40 is programmed to adjust the execution of the MR imaging examination program 42 in response to a thermal parameter measured by the one or more sensors TS, VS indicating the cooling system 30 has insufficient cooling capacity. FIG. 1 diagrammatically indicates suitable processing at a high level. The exam card 42 is read by the MR controller 40 and is processed by an optional exam card thermal budget adjustment program or module 44, by which the MR controller 40 is programmed to analyze the exam card 42 prior to its execution to estimate a heat load to be generated by executing the exam card. If the cooling system 30 has insufficient cooling capacity at the air temperature measured by the air temperature sensor ATS to dissipate the estimated heat load, then the MR controller 40 adjusts the exam card 42 prior to its execution to reduce the heat load, for example by inserting pauses into MR scans or between MR scans of the exam card 42, adjusting scan parameters to lower the magnetic field gradient metric (e.g. $G_{rms}$) or to lower an RF power metric (e.g. $B_{1,rms}$) of one or more MR scans, re-ordering scans of the exam card 42 to more evenly distribute the thermal loading, omitting an MR scan (preferably one with high heat load), or so forth. Advantageously, the exam card 42 typically includes the capability of representing a pause during or between MR scans, in order to allow for operations such as administering a magnetic contrast agent, positioning a local RF coil, or so forth. Thus, the optional exam card thermal budget adjustment program or module 44 can leverage these existing features of the exam card representational language or syntax to insert pauses for thermal adjustment, so that implementing the optional exam card thermal budget adjustment program or module 44 does not require substantial (or, in some cases any) modification of the exam card language or syntax.

After the optional a priori analysis and (if appropriate) adjustment of the exam card 42 performed by the optional exam card thermal budget adjustment program or module 44, an exam card execution module or program 46 is applied by which the MR controller 40 is programmed to operate the MR imaging device 10 to execute the exam card 42 (with the modifications applied by the optional exam card thermal budget adjustment program or module 44 if such modifications were made). During execution of the (optionally modified) exam card 42, a real-time thermal adjustment module or program 48 runs concurrently with the execution 46 to adjust the execution of the exam card in response to a thermal parameter measured by the one or more sensors TS, VS indicating the cooling system has insufficient cooling capacity. For example, if a mixing valve is close to its limit at which only cold water from the heat exchanger 34 is being applied to the heat-generating component, with little or no hot water from the return line 38 being mixed in, this indicates there is only a small remaining reserve capacity before mixing valve 36 is unable to accommodate further heat load. Similarly, if a temperature reading of a temperature sensor TS begins to rise this indicates insufficient capacity for dissipating heat generated by the heat-generating component. The real-time thermal adjustment module or program 48 may optionally also take into account the current outdoor temperature measured by the air temperature sensor ATS to take into account the current cooling capacity of the air-cooled chiller 28 in assessing whether an adjustment is needed, e.g. if the outdoor temperature is high then adjustment may be made sooner than if the outdoor temperature is low. The thermal adjustments by the real-time thermal adjustment module or program 48 may include, for example, inserting a pause in an upcoming MR scan, or inserting a pause between two upcoming MR scans, adjusting an MR scan parameter to lower heat load, omitting an upcoming MR scan (preferably one with high heat load), temporarily shutting off the cryo-compressor 18 (if thermal inertia of the magnet is sufficient that such a shut-off will not run a risk of helium loss or magnet quench), or so forth. Advantageously, the exam card execution component 46 typically includes the capability of inserting an unscheduled pause (i.e., a pause that is not part of the program represented by the exam card 42) during execution of an MR scan or between MR scans, for example to allow for the imaging subject to be instructed to hold his or her breath so as to reduce respiratory cycling artifacts, or to allow for the imaging subject to recover from a coughing fit or other disturbance. Similarly, the exam card 42 also typically provides scan parameters for the scan(s), which can be modified by the by the real-time thermal adjustment module or program 48 by adjusting the stored values. Thus, real-time thermal adjustment module or program 48 does not require substantial (or, in some cases any) modification of the exam card execution component 46.

In the foregoing, the exam card thermal budget adjustment program or module 44 has been described as an optional component that may optionally be provided in addition to the real-time thermal adjustment module or program 48. However, it is also contemplated to include the exam card thermal budget adjustment program or module 44 while omitting the real-time thermal adjustment module or program 48.

Further, while the exam card thermal budget adjustment program or module 44 is described herein as executing upon reading in the exam card 42 shortly prior to its execution by the execution module or program 44, in other embodiments the exam card thermal budget adjustment program or module 44 may be executed at an earlier time. For example, the exam card thermal budget adjustment program or module 44 may be applied as part of the preparation process for constructing and finalizing the exam card 42 before it is stored for later loading and execution by the MR controller 40. In such cases, the air temperature sensor ATS cannot be used to assess the outdoor air temperature proximate to the chiller 28 at the time the exam card 42 will be executed, since in such an embodiment the exam card thermal budget adjustment program or module 44 is run a sufficiently long time before exam card execution (e.g., the night before) so that the air temperature sensor ATS does not provide this information. Accordingly, in such embodiments the "current" outdoor air temperature for performing the a priori thermal analysis may be obtained from a weather forecast or other prediction of the outdoor temperature at about the time the exam card 42 is scheduled to be executed. In some embodiments, an outdoor temperature may be coarsely assumed for this purpose on the basis of the current season, e.g. fixed approximate air temperatures may be assumed for winter, spring, summer, and fall, possibly also taking into account time-of-day in a region such as the U.S. southwest where temperature can vary by a large amount between early morning, noon, and evening.

As previously noted, the MR controller 40 comprises an electronic processor (e.g. the illustrative computer 41 or a dedicated microprocessor- or microcontroller-based MR controller) along with ancillary components such as non-transitory storage medium/media storing MR scan pulse sequences, analog-to-digital and/or digital-to-analog circuitry for interfacing with analog components or signals of the MR imaging device 10, and/or so forth. It will be further appreciated that the disclosed modules or programs 44, 46, 48 may be additionally or alternatively embodied as a non-transitory storage medium storing instructions that are readable and executable by the MR controller 40 to perform the described tasks, including interfacing with the MR imaging device 10 as appropriate. Such non-transitory storage medium may include, for example, a hard disk drive or other magnetic storage medium, a solid state drive, flash memory or other electronic storage medium, an optical disk or other optical storage medium, various combinations thereof, or so forth. The MR controller 40 typically includes user interfacing components including a display (e.g. illustrative computer display 49 of the illustrative MR controller computer 41) and one or more user input devices (e.g. keyboard, mouse, touch-sensitive overlay of the display 49, or so forth). In some embodiments, the estimated thermal budget may be displayed on an energy consumption dashboard (or window) shown on the display 49.

Figure 2:
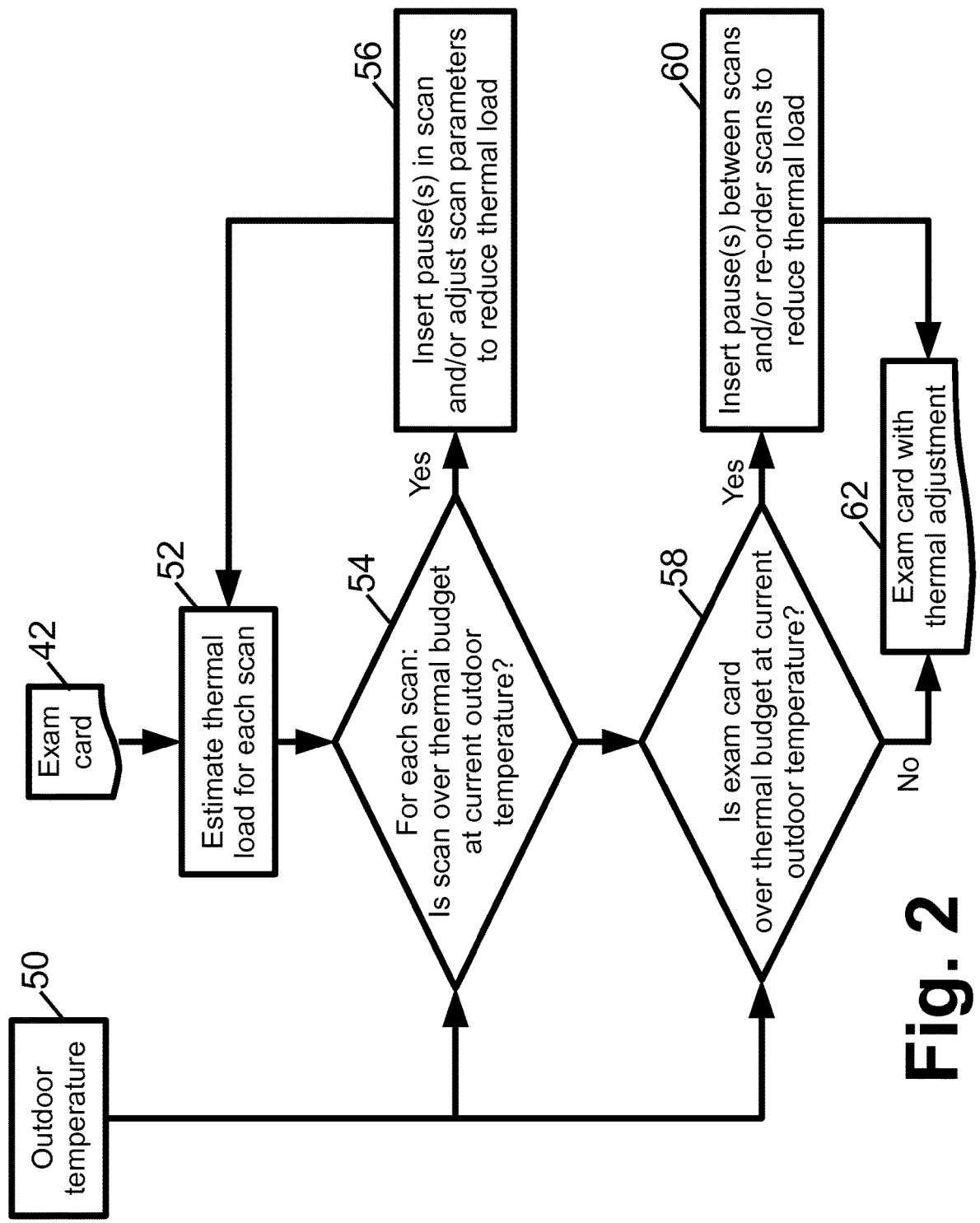
FIG. 2 diagrammatically shows an illustrative embodiment of the exam card thermal budget adjustment performed by the MR controller of FIG. 1.
Figure 3:
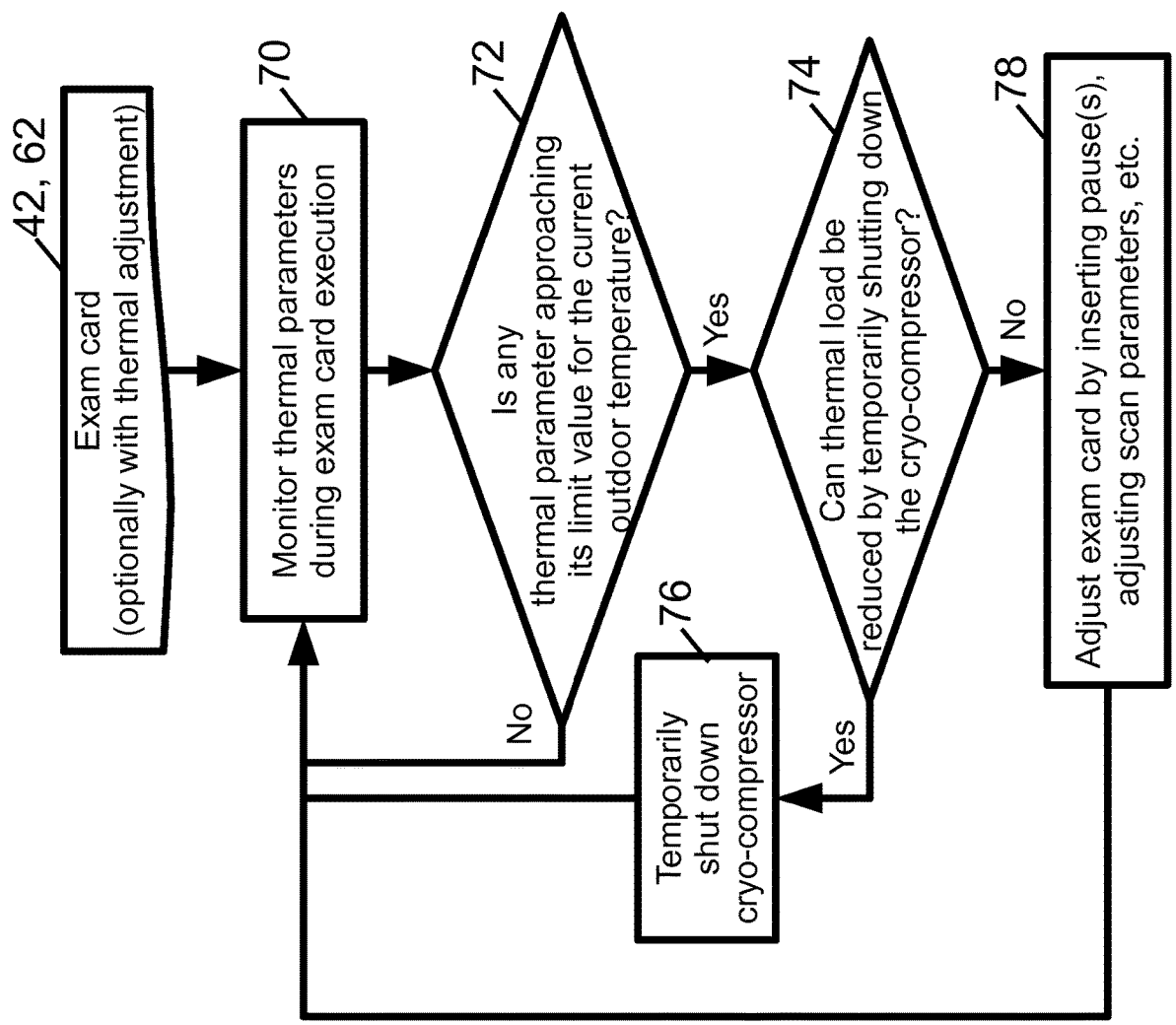
FIG. 3 diagrammatically shows an illustrative embodiment of real-time thermal adjustment performed by the MR controller of FIG. 1.

With reference now to FIGS. 2 and 3, some non-limiting illustrative methods are described which may be performed by the exam card thermal budget adjustment program or module 44 (FIG. 2), and by the real-time thermal adjustment module or program 48 (FIG. 3).

With reference now to FIG. 2, in an illustrative implementation method the exam card thermal budget adjustment program or module 44 receives the exam card 42 prior to its execution, along with an air temperature 50 provided by the air temperature sensor ATS (if the a priori analysis/adjustment is performed sufficiently close to the time of execution of the exam card 42) or estimated based on a weather forecast, current season, or other information (if the air temperature sensor ATS is unavailable and/or the a priori analysis is being performed long enough before exam card execution that the sensor ATS cannot provide a useful air temperature estimate). In an operation 52, the thermal load of each MR scan of the exam card 42 is estimated. In a rough approach, this estimate can be made based on the largest root-mean-square magnetic field gradient amplitude ($G_{rms}$) that is generated during the scan and/or the largest root-mean square $B_1$ field ($B_{1,rms}$) that is generated during the scan. A more accurate estimate can be computed by the time-integral of $G_{rms}$ and/or $B_{1,rms}$ over the time the gradient(s) and/or RF pulse(s), respectively, are applied. The thermal load estimate may optionally also take into account other factors such as the RF excitation pulse energy being generated by the RF amplifier 24 during the scan, again estimated as a peak RF energy or as a time-integral of the RF pulse(s) energy over the time of the RF pulse(s). Optionally, additional or other heat loads may be similarly taken into account in estimating the heat load of each MR scan. Some further embodiments of the thermal load estimation operation 52 are described later herein with reference to FIG. 4.

In an operation 54, each MR scan is analyzed in isolation (that is, without consideration of the other MR scans, if any, of the exam card 42). Taking into account the cooling capacity of the chiller 28 estimated from the outdoor temperature 50, it is determined whether the cooling system 30 will have sufficient cooling capacity to dissipate heat generated by each MR scan considered in isolation. This determination may take into account factors such as the thermal efficiency of the various cooling system components (e.g., the coolant circuits 32, the heat exchangers 34, the mixing ranges of the mixing valves 36). If any MR scan, taken individually, is found to present an unacceptably high heat load on the basis of the determination made in operation 54, then this is addressed by an adjustment 56 that will be operative within the scan, such as by inserting a pause within the scan and/or adjusting scan parameters of the scan.

After analyzing (and, if appropriate, adjusting) each MR scan considered individually so that no scan by itself presents a thermal "overload", a further operation 58 is applied to analyze whether the combination of MR scans making up the exam card 42 may cumulatively present too high a thermal load for the cooling system 30 operating at the current air temperature 50. This analysis 58 accounts for the possibility that although the heat from two scans may be able to be dissipated individually, performing the two scans in successive may present to much of a heat load. This analysis can be performed, for example, by taking into account the expected heat remaining to be dissipated after each MR scan and using this as the starting point for the heat load analysis of the next MR scan. If the operation 58 determines that the exam card as a whole is over thermal budget at the current outdoor air temperature 50, then an adjustment 60 is made to facilitate heat dissipation of this cumulative heat load. The adjustment(s) 60 may include, for example, inserting a pause between successive MR scans, and/or re-ordering the MR scans. The final output is an adjusted exam card 62 with thermal adjustment(s) made in the operations 56, 60.

In the illustrative embodiment, the thermal adjustment(s) are actually made to the exam card 42 in the operations 56, 60 without input from the MR imaging device operator. In an alternative embodiment, each adjustment may first be displayed, e.g. on the computer display 49, to the MR imaging device operator who decides whether the adjustment should actually be made—and the adjustment is only made in the exam card 42 upon approval by the operator.

With reference to FIG. 3, an illustrative implementation method for implementing the real-time thermal adjustment module or program 48 is described. The exam card 42, or alternatively the modified exam card 62 output by the method of FIG. 2, serves as input, and is executed by the exam card execution module or program 46 (see FIG. 1). During this execution, the real-time thermal adjustment module or program 48 performs a monitoring operation 70 during which it monitors thermal parameters such as those output by the temperatures sensors TS and/or the mixing valve sensors VS. The monitoring performs continual checking 72 as to whether any monitored thermal parameter is approaching a limit value. So long as all monitored thermal parameters are in acceptable respective ranges, no further action is performed by the real-time thermal adjustment module or program 48 (indicated by flow arrow returning from check 72 to monitoring 70). If, however, the check operation 72 detects a thermal parameter that is approaching a limit value, then remedial action is taken. The operation 72 may use various criteria for deciding when such remedial action should be taken. For example, in one contemplated approach, if any mixing valve approaches within X % of full open flow from the heat exchanger 34 (where X may be, e.g. 90% or 95%, and moreover may be different for different cooling circuits 32) then remedial action is taken. Similarly, if any inlet line and/or return line temperature sensor TS indicates a temperature above some threshold value then remedial action is taken. The temperature sensor TS monitoring the coolant inflow to the heat exchangers 34 may additionally or alternatively be monitored to detect insufficiency of cooling—this sensor directly detects if the chiller 28 is unable to supply chilled water at the designed temperature. In contemplated more complex embodiments, time derivatives of these parameters may be taken into account, e.g. a faster change in valve setting, or a more rapid return line temperature rise, may call for a more rapid response compared with a more gradual change.

In an operation 74 of the illustrative embodiment, the first considered remedial response is to determine whether the cryo-compressor 18 can be safely shut off for some temporary time interval. This is the first considered response in the illustrative example because (1) shutting down the cryo-compressor 18 (when safe to do so) does not adversely impact the MR examination; and (2) the large thermal inertia of the MR magnet 12 (or, more precisely, of its cooling system, e.g. the LHe cryostat) ensures that it is likely that the cryo-compressor 18 can be safely shut down for at least a substantial portion of the time of execution of the exam card 42, 62; and (3) the operating cryo-compressor 18 is a large thermal load so that shutting it down temporarily has a high likelihood of effectively remediating an incipient thermal runaway condition. Whether the operation 74 determines that temporarily turning off the cryo-compressor 18 is a suitable (first) response depends on several factors. First, the cryo-compressor 18 must be currently running—if it is already off (e.g., because the cryostat temperature is at is lower value of a dead band) then no heat load reduction can be obtained by this approach. If the cryo-compressor 18 is currently running, then it is determined whether the cryo-compressor can be safely shut off without risk of helium loss or magnet quench. For example, if the cryo-compressor 18 has just turned on in response to the magnet cryostat temperature reaching the top of its control dead band, then turning off the cryo-compressor 18 is not an option (or, such a shut-off must be for a very short duration). On the other hand, if the magnet cryostat is at or near the bottom of its dead band then the cryo-compressor 18 may be turned off for a relatively long time interval without risk of helium loss or magnet quenching. In this case, flow passes to an operation 76 by which the cryo-compressor 18 is temporarily turned off.

If operation 76 is executed to turn off the cryo-compressor 18, then some provision is made to ensure it turns back on in sufficient time to maintain integrity of the liquid helium in the magnet cryostat and preclude any possibility of magnet quenching. To this end, the magnet cryostat temperature can be monitored, and the cryo-compressor 18 turned back on if the cryostat temperature reaches the top of its dead band. Optionally, a hard time limit on the temporary shut-off may also be imposed.

If it is determined in the operation 74 that temporary turn-off of the cryo-compressor 18 cannot be performed to remediate insufficient cooling capacity indicated in operation 72, then flow passes to operation 78 where a further (or different) remedial action is taken. The remedial action performed by the operation 78 may include, for example: inserting a pause in the currently executing MR scan (preferably done only in the case of rapid approach of a thermal parameter toward its limit value), inserting a pause in an upcoming scan; inserting a pause between two successive scans; lowering scan parameter values for an upcoming scan; or so forth. Flow then returns to operation 70 for continued monitoring of the thermal parameters, and further iterations of operation 78 may be performed if necessary to remediate the thermal issue.

In some instances, the initial detection of a thermal parameter approaching its limit value in the operation 72 may trigger a temporary cryo-compressor shut-down as per operations 74, 76, but this may turn out to be insufficient to alleviate the cooling insufficiency, at which point process flow will pass to operation 78 to take further remedial action. For example, the cryo-compressor shut-down may not arrest the movement of the return line temperature or mixing valve toward its limit value. In another scenario, the cryo-compressor shut-down may be effective to arrest the movement toward the limit value, but the cryo-compressor may later need to be turned back on to maintain LHe in the magnet 12, after which point the return line temperature or mixing valve setting may move again toward its limit value. In either case, flow will then pass to operation 78 to take further remedial action to address the thermal overload situation.

Although not shown in FIG. 3, it is contemplated for the operation 72 to further take into account the cooling capacity of the chiller 28 as indicated by the air temperature sensor ATS. For example, remedial action may be taken sooner if the air temperature is high, so that the cooling system 30 will be less capable of dealing with a thermal overload condition.

Figure 4:
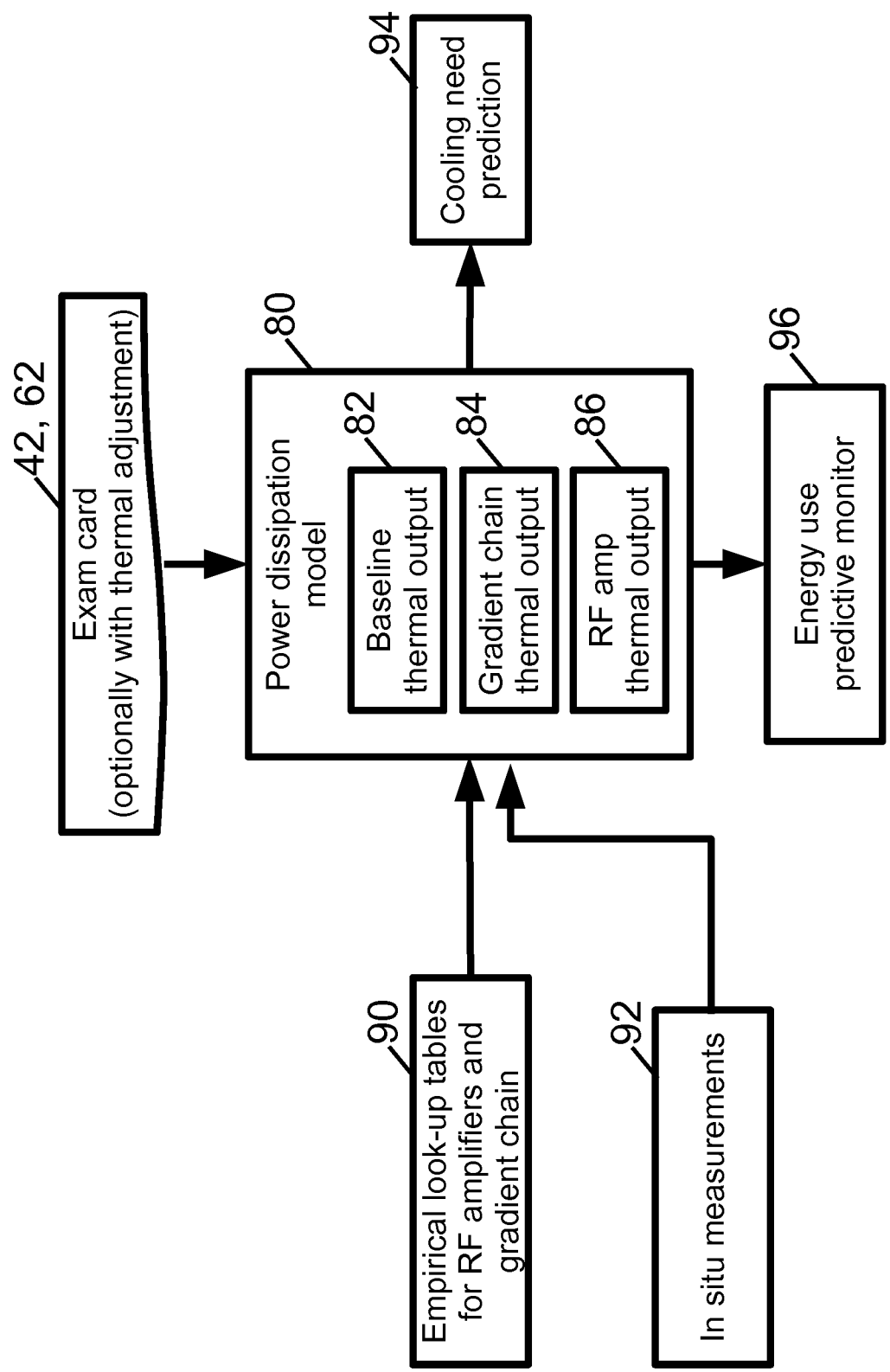
FIG. 4 diagrammatically shows an illustrative power dissipation model suitably used in the supporting infrastructure for the MR imaging device of FIG. 1.

With reference now to FIG. 4, an illustrative embodiment is described of a power dissipation model 80 that may, for example, be implemented on the MR controller to implement the thermal load estimation operation 52 of FIG. 2. The power dissipation model 80 includes a baseline thermal output 82 that represents the heat dissipation required by components of the MR imaging device 10 whose power dissipation is largely independent of the particulars of the MR scans being executed. Such components include, for example, the liquid cooling cabinet 30 and cryo-compressor 18. The baseline thermal output 82 is thus modeled as a constant thermal dissipation that is independent of the MR scan. The baseline thermal output 82 may, for example, be measured as the load on the chiller 28 when the MR imaging device 10 is in its idle state.

The thermal model 80 further includes a gradient chain thermal output 84 that models the heat dissipation required by the magnetic field gradient chain including the magnetic field gradient amplifiers 20 and the magnetic field gradient coils 22. Power dissipation of the magnetic field gradient amplifiers 20 depends upon the particular gradient amplifier configuration; in one typical configuration, the gradient amplifiers 20 include an amplifiers power supply that drives individual amplifiers for the individual gradient coils (e.g. the x- and y-transverse coils and the longitudinal z-coil). For this configuration, the magnetic field gradient amplifiers' heat dissipation may be represented as:

$$P_{grad\ amp} = \sum_{i=x,y,z} P_i(I_i, f_i) + P_{amp\ p.s.} \quad (1)$$

where $P_{amp\ p.s.}$ is the power dissipation of the amplifiers' power supply, $I_i$ is the drive current for the $i^{th}$ gradient channel (where i=x, y, or z), $f_i$ is a dominant frequency of the drive current for the $i^{th}$ gradient channel, and $P_i(I_i, f_i)$ is the power dissipation of the $i^{th}$ gradient amplifier. The drive current $I_i$ for each gradient channel x, y, and z is calculated from the rms gradient strength values and scan duration times, which are in the exam card 42, 62, and from the known coil sensitivity. Although not indicated in Equation (1), $P_{amp\ p.s.}$ may also be a function of the drive currents and/or dominant frequencies of the amplifier channels. The dissipation models $P_i(I_i, f_i)$ may be linear, quadratic, or have some other form depending upon the configuration of the amplifiers. Although not indicated in Equation (1), $P_{amp\ p.s.}$ may also be a function of the current metrics and/or dominant frequencies of the amplifier channels.

The power dissipation of the x-, y-, and z-gradient coil channels is modeled here using a simple resistive model, so that:

$$P_{grad\ coils} = \sum_{i=x,y,z} I_i^2 R_i(f_i) \quad (2)$$

where $R_i(f_i)$ is the frequency-dependent resistance of the $i^{th}$ gradient coil. The resistances $R_i(f_i)$ can be obtained from per-channel resistance measurements and provided in a look-up table. The main frequency components of the MR scans of the exam card 42, 62 are used to determine the coil resistances $R_i(f_i)$ for the scan.

The thermal model 80 further includes a radio frequency (RF) amplifier thermal output 86 that models the heat dissipation required by the RF amplifier 24. In the illustrative power dissipation model 80, the RF amplifier power dissipation 86 depends on the average RF power and the peak RF power. For MR scans employing a coil array or other set of multiple excitation coils, both average and peak RF power are determined for each channel based on the exam card 42, 62. An empirical lookup table is suitably used to calculate the mains power drawn by the RF amplifier 24 for a given average and peak RF power pair. Inclusion of the RF amplifier power dissipation 86 assumes that the RF amplifier 24 is water cooled, as in the illustrative example of FIG. 1.

More generally, since the thermal model 80 is used for assessing load on the chiller 28, the components of the thermal model 80 are limited to those components that are water-cooled using chilled water supplied by the chiller 28. Components which are air-cooled are not included as they do not impact chiller capacity. Alternatively, in some embodiments it is contemplated to also include air-cooled components in order to provide a more complete assessment of total energy consumption by the MR imaging apparatus. This can further assist MR laboratory managers in optimizing energy efficiency of the MR imaging apparatus.

In general, the thermal model 80 receives as inputs the magnetic field information and RF excitation information for the MR scans of the exam card 42, 62. Empirical look-up tables 90 provide information such as mains power as a function of (average,peak) RF power pair and the gradient coil resistances as a function of frequency. To implement the real-time thermal adjustments 48, in-situ measurements 92 may be provided, e.g. of the actual amplifier drive currents. Temperature and/or flow measurement of cooling water and temperature measurements of the environment (e.g. measurement of air temperature using the air temperature sensor ATS) can be fed into the thermal model 80 to make it more accurate or to anticipate on extreme environmental conditions. The total power dissipation (i.e. cooling need prediction 94) is computed as the sum of the baseline thermal output 82, the gradient chain thermal output 84, and the RF amplifier thermal output 86.

The disclosed thermal model 80 is beneficial for providing more detailed thermal information for performing thermal adjustments of MR imaging examinations (e.g. thermal adjustment of exam cards), such as those described with reference to FIGS. 1-3. However, the thermal model 80 may additionally or alternatively be used as a diagnostic tool for assessment of energy consumption by the MR imaging apparatus. In this usage, energy consumption of the MR imaging apparatus is more effectively monitored using the thermal model 80, and this information may be used to adjust MR imaging apparatus operations to reduce energy consumption so as to reduce the total cost of ownership.

Figure 5:
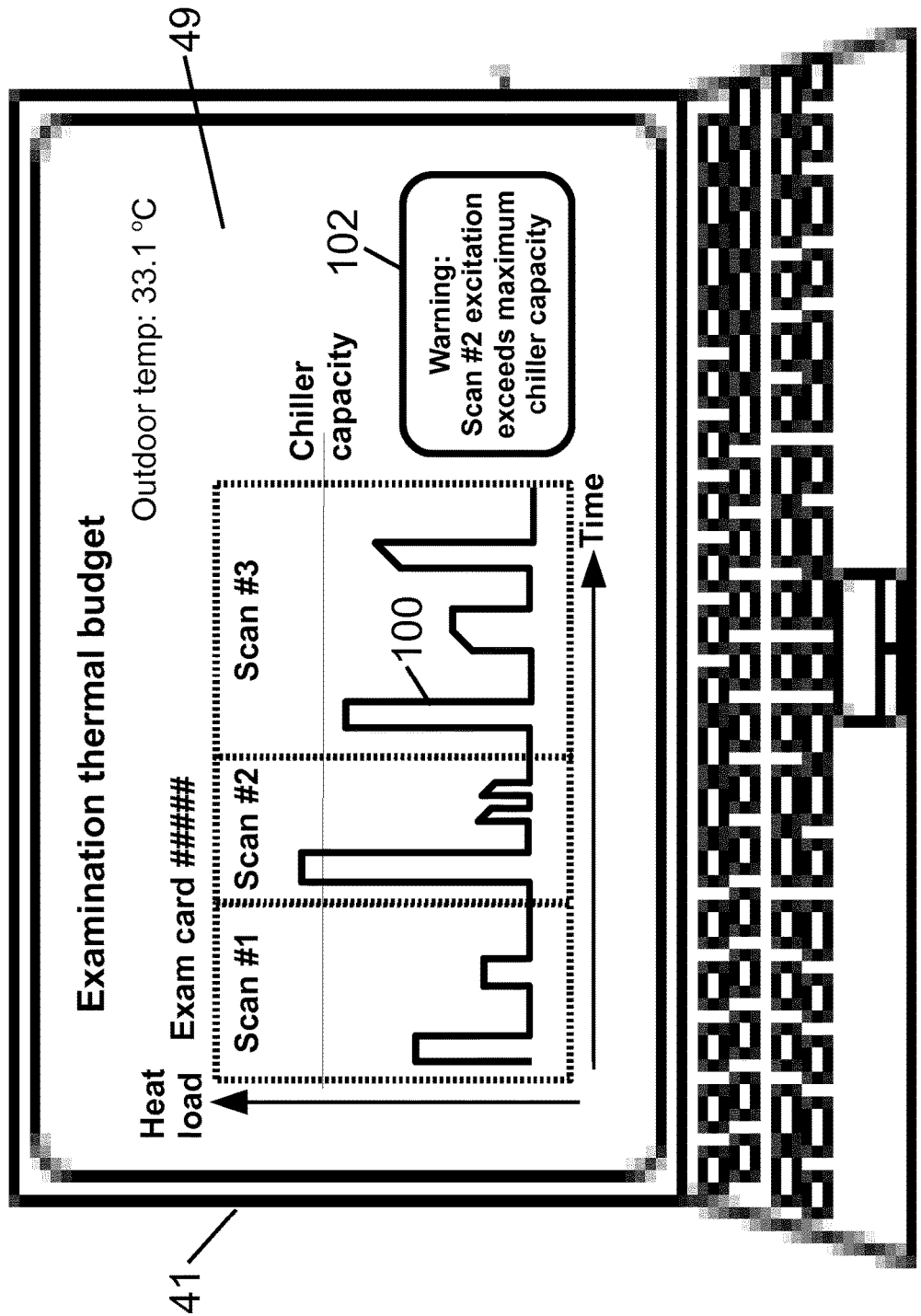
FIG. 5 diagrammatically shows the MR controller computer of FIG. 1 displaying a MR examination thermal budget dashboard.

With continuing reference to FIG. 4 and with further reference to FIG. 5, in some embodiments the total power dissipation 94 is also fed to an energy use predictive monitor 96, which as per FIG. 5 may be implemented as a dashboard shown on the display 49 of the computer 41 implementing the illustrative MR controller 40. The illustrative dashboard includes a plot 100 of the predicted total power dissipation 94, along with other salient information such as the outdoor air temperature measured by the air temperature sensor ATS. The illustrative dashboard display includes a maximum chiller capacity threshold—it is noted by an alarm indicator 102 that the excitation phase of Scan #2 exceeds this maximum chiller capacity threshold. Preferably, if the MR technician makes adjustments to the exam card 42 to produce the exam card 62 with thermal adjustments, the total power dissipation 94 with these adjustments is re-computed by the power dissipation model 80 and the plot 100 updated accordingly. Although not illustrated, it is also contemplated to include plots of individual power dissipation components, e.g. a plot of the gradient chain thermal output 84 and/or the RF amplifier thermal output 86. Such component plots may assist the MR technician in deciding appropriate modifications of the exam card.

It may be noted that while FIG. 5 illustrates the MR examination thermal budget dashboard as occupying the entire display 49, in other embodiments this information may be displayed in a smaller window or viewport shown on the display 49.

The thermal model 80 and energy use predictive monitor 96 may additionally or alternatively be used to provide visualization of energy consumption of the MR imaging apparatus for the purpose of assessing and, potentially, adjusting operations to reduce overall energy consumption and provide more ecologically friendly MR imaging. For these applications, it may be useful to extend the plot shown in FIG. 5 to display energy usage over an entire work shift, or over some other selected time interval (a day, a week, a month, et cetera). For the purpose of visualization of energy consumption, the thermal model 80 and the monitor 96 may be used to display thermal loads prospectively (predictive mode) as already described, or may display thermal loads retrospectively, that is, summarizing and visualizing past energy usage. The monitor 96 may display the total heat dissipation estimate, and optionally various other heat dissipation estimates (e.g. the heat output of a magnetic field gradient chain 20, 22, and/or the heat output by the RF amplifier 24) as estimated by the model 80 over a selected prospective or retrospective time interval. When operated in predictive mode, various "what if" scenarios may also be executed to assess the impact on energy consumption of various contemplated operational adjustments.

The illustrative embodiments are directed to the illustrative magnetic resonance (MR) imaging device 10 cooled using the illustrative air-cooled chiller 28. However, it will be appreciated that the disclosed embodiments can be employed with other sources of chilled water beside an air-cooled chiller (although aspects employing measurement of air temperature using the air temperature sensor ATS would be omitted or replaced by suitable sensing of another parameter impacting cooling capacity of the source of chilled water).

The illustrative embodiments are directed to the illustrative magnetic resonance (MR) imaging device 10 which is cooled using chilled water. The disclosed approaches are of particular value for MR imaging devices since thermal overload in an MR imaging device can introduce significant problems such as loss of liquid helium and magnet quenching. However, it will be appreciated that the disclosed approaches for remediating thermal overload are also applicable to other medical imaging devices that produce significant heat load and are cooled by chilled water, such as positron emission tomography (PET) imaging devices, transmission computed tomography (CT) imaging devices, hybrid devices (e.g. hybrid PET/MR or PET/CT devices), and so forth.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance (MR) imaging apparatus comprising:
    an MR imaging device including a magnet and heat generating components;
    a cooling system connected to cool the heat generating components of the MR imaging device using chilled water;
    one or more sensors each configured to measure a thermal parameter of the heat generating components of the MR imaging device or of the cooling system; and
    an MR controller comprising an electronic processor programmed to control the MR imaging device to execute an MR imaging examination program and to adjust the execution of the MR imaging examination program, without turning off the MR imaging device, in response to a thermal parameter measured by the one or more sensors indicating the cooling system has insufficient cooling capacity.

2. A magnetic resonance (MR) imaging apparatus comprising:
    an MR imaging device including a magnet and heat generating components;
    a cooling system connected to cool the heat generating components of the MR imaging device using chilled water, wherein the cooling system including at least a coolant circuit configured to cool at least one heat generating component of the MR imaging device using coolant flowing in the coolant circuit; and
    an MR controller comprising an electronic processor programmed to control the MR imaging device to execute an MR imaging examination program and to analyze the MR imaging examination program prior to its execution to:
        estimate a heat load to be generated by executing the MR imaging examination program; and
        adjust the MR imaging examination program prior to its execution if the cooling system has insufficient cooling capacity to cool the estimated heat load without turning off the MR imaging device.

3. A magnetic resonance (MR) imaging method performed by (i) an MR imaging device including a magnet and heat generating components and (ii) a cooling system connected to cool the heat generating components of the MR imaging device using chilled water; wherein the cooling system includes:
    a coolant circuit configured to cool at least one heat generating component of the MR imaging device using coolant flowing in the coolant circuit; and
    a heat exchanger connected with the coolant circuit to transfer heat from the coolant to the chilled water;
    wherein the coolant circuit includes a mixing valve that mixes coolant from the heat exchanger with coolant from a return line of the coolant circuit to output mixed coolant at a set point temperature; and wherein the one or more sensors include a sensor that outputs the valve setting of the mixing valve of the coolant circuit;

wherein the MR imaging method comprises:

executing an MR imaging examination program using the MR imaging device;

during the executing, monitoring thermal parameters of at least one of the MR imaging device and the cooling system; and adjusting the execution of the MR imaging examination program in response to the monitored thermal parameters indicating the cooling system has insufficient cooling capacity.

4. The MR imaging apparatus of claim 1 wherein:

the heat generating components of the MR imaging device include a cryo-compressor connected to maintain the magnet in a superconducting state; and the MR controller is programmed to adjust the execution of the MR imaging examination program by turning off the cryo-compressor during execution of the MR imaging examination program in response to a thermal parameter measured by the one or more sensors indicating the cooling system has insufficient cooling capacity.

5. The MR imaging apparatus of claim 1 wherein the MR controller is programmed to adjust the execution of the MR imaging examination program by inserting a pause during execution of an MR scan of the MR imaging examination program or between execution of successive MR scans of the MR imaging examination program in response to a thermal parameter measured by the one or more sensors indicating the cooling system has insufficient cooling capacity.

6. The MR imaging apparatus of claim 1 wherein the MR controller is programmed to determine whether the cooling system has insufficient cooling capacity using a thermal model comprising:

a gradient chain thermal output component computing thermal output of magnetic field gradient amplifiers and magnetic field gradient coils based on magnetic field gradient coil drive currents of the MR imaging examination program and dominant frequencies of the magnetic field gradient coil drive currents; and a radio frequency (RF) amplifier thermal output component computing thermal output of an RF amplifier based on average and peak RF power delivered by the RF amplifier during the MR imaging examination program.

7. The MR imaging apparatus of claim 1 wherein the MR controller is programmed to adjust the execution of the MR imaging examination program by adjusting an MR scan parameter of an MR scan of the MR imaging examination program in response to a thermal parameter measured by the one or more sensors indicating the cooling system has insufficient cooling capacity.

8. The MR imaging apparatus of claim 1 wherein the MR controller is programmed to adjust the execution of the MR imaging examination program by one or both of (i) skipping execution of an MR scan of the MR imaging examination program or (ii) re-ordering MR scans of the MR imaging examination program in response to a thermal parameter measured by the one or more sensors indicating the cooling system has insufficient cooling capacity.

9. The MR imaging apparatus of claim 1 wherein the heat generating components of the MR imaging device include one or more of a magnetic field gradient coil amplifier, a magnetic field gradient coil, and a radio frequency (RF) amplifier, and the one or more sensors include a temperature sensor measuring temperature of the heat generating component or a temperature sensor measuring temperature of one or both of a coolant inlet line flowing into the heat generating component and a coolant return line flowing out of the heat generating component.

10. The MR imaging apparatus of claim 1 further comprising:

a display;

wherein the heat generating components include:

a magnetic field gradient chain including magnetic field gradient amplifiers and magnetic field gradient coils driven by the magnetic field gradient amplifiers, and a radio frequency (RF) amplifier connected to drive an RF coil;

and wherein the MR controller is further programmed to estimate heat dissipation over the execution of the MR imaging examination program using a thermal model including a magnetic field gradient chain heat output component functionally dependent on magnetic field gradient currents applied during execution of the MR imaging examination program and an RF amplifier heat output component) functionally dependent on average and peak RF power applied during execution of the MR imaging examination program.

11. The MR imaging apparatus of claim 1 wherein the cooling system includes:

a coolant circuit configured to cool at least one heat generating component of the MR imaging device using coolant flowing in the coolant circuit;

a heat exchanger connected with the coolant circuit to transfer heat from the coolant to the chilled water;

wherein the one or more sensors include a temperature sensor measuring temperature of the coolant at a measurement point in the coolant circuit.

12. The MR imaging apparatus of claim 1 wherein the cooling system includes:

a coolant circuit configured to cool at least one heat generating component of the MR imaging device using coolant flowing in the coolant circuit; and a heat exchanger connected with the coolant circuit to transfer heat from the coolant to the chilled water;

wherein the coolant circuit includes a mixing valve that mixes coolant from the heat exchanger with coolant from a return line of the coolant circuit to output mixed coolant at a set point temperature; and wherein the one or more sensors include a sensor that outputs the valve setting of the mixing valve of the coolant circuit.

13. The MR imaging apparatus of claim 1 further comprising:

an air temperature sensor;

wherein the MR controller is programmed to determine whether the thermal parameter measured by the one or more sensors indicates the cooling system has insufficient cooling capacity further based on the air temperature measured by the air temperature sensor.

14. The MR imaging apparatus of claim 1 further comprising:

an air temperature sensor;

wherein the MR controller is further programmed to analyze the MR imaging examination program prior to its execution to:

estimate a heat load to be generated by executing the MR imaging examination program; and adjust the MR imaging examination program prior to its execution if the cooling system has insufficient cooling capacity at the air temperature measured by the air temperature sensor to cool the estimated heat load.

15. The MR imaging apparatus of claim 14 wherein the adjustment of the MR imaging examination program prior to its execution includes one or more of: inserting a pause between successive MR scans of the MR imaging examination program; inserting a pause during an MR scan of the MR imaging examination program; re-ordering MR scans of the MR imaging examination program; and modifying a parameter of an MR scan of the MR imaging examination program.

16. The MR imaging apparatus of claim 2 further comprising:
an air temperature sensor;
wherein the MR controller is programmed to adjust the MR imaging examination program prior to its execution if the cooling system has insufficient cooling capacity at the air temperature measured by the air temperature sensor to dissipate the estimated heat load.

17. The MR imaging apparatus of claim 2, wherein the adjustment of the MR imaging examination program prior to its execution includes one or more of: inserting a pause between successive MR scans of the MR imaging examination program; inserting a pause during an MR scan of the MR imaging examination program; re-ordering MR scans of the MR imaging examination program; and modifying a parameter of an MR scan of the MR imaging examination program.

18. The MR imaging apparatus of claim 2, further comprising:
one or more sensors each configured to measure a thermal parameter of the heat generating components of the MR imaging device or of the cooling system;
wherein the MR controller is further programmed to adjust the execution of the MR imaging examination program in response to a thermal parameter measured by the one or more sensors indicating the cooling system has insufficient cooling capacity.

19. The MR imaging apparatus of claim 2, wherein:
the heat generating components of the MR imaging device include a cryo-compressor connected to maintain the magnet in a superconducting state; and
the MR controller is programmed to adjust the execution of the MR imaging examination program by turning off the cryo-compressor during execution of the MR imaging examination program in response to the cooling system having insufficient cooling capacity.

20. The MR imaging method of claim 3, further comprising:
determining the cooling capacity of the cooling system based at least on a current air temperature.

* * * * *